United States Patent
Fahs et al.

(10) Patent No.: US 8,436,693 B2
(45) Date of Patent: May 7, 2013

(54) FILTER-TRACKING AND CONTROL METHOD

(75) Inventors: Bassem Fahs, Caen (FR); Patrick A. Y. Ozenne, Benouville (FR)

(73) Assignee: ST-Ericsson SA, Geneva (CH)

( * ) Notice: Subject to any disclaimer, the term of this patent is extended or adjusted under 35 U.S.C. 154(b) by 753 days.

(21) Appl. No.: 12/438,542

(22) PCT Filed: Aug. 22, 2007

(86) PCT No.: PCT/IB2007/053357
§ 371 (c)(1),
(2), (4) Date: Jan. 28, 2010

(87) PCT Pub. No.: WO2008/023340
PCT Pub. Date: Feb. 28, 2008

(65) Prior Publication Data
US 2010/0127791 A1     May 27, 2010

(30) Foreign Application Priority Data
Aug. 23, 2006   (EP) ................................. 06300886

(51) Int. Cl.
*H04B 1/18* (2006.01)
*H04B 1/10* (2006.01)

(52) U.S. Cl.
USPC ....... 333/17.1; 333/174; 455/123; 455/150.1; 455/192.2; 455/340; 455/296

(58) Field of Classification Search ................. 333/17.1, 333/174; 455/120, 123, 125, 150.1, 151.1, 455/151.2, 192.1, 192.2, 295, 296, 340
See application file for complete search history.

(56) References Cited

U.S. PATENT DOCUMENTS

| | | | |
|---|---|---|---|
| 4,361,894 A | 11/1982 | Kurihara et al. | |
| 5,420,552 A | 5/1995 | Sakka | |
| 5,826,180 A * | 10/1998 | Golan | 455/302 |
| 6,392,501 B1 | 5/2002 | Murtojarvi | |
| 6,785,529 B2 * | 8/2004 | Ciccarelli et al. | 455/324 |
| 6,940,348 B2 | 9/2005 | Confalonieri et al. | |
| 7,263,344 B2 * | 8/2007 | Manku | 455/323 |
| 2001/0024145 A1 | 9/2001 | Cullbom et al. | |
| 2003/0162521 A1 * | 8/2003 | Vorenkamp et al. | 455/302 |
| 2004/0174849 A1 | 9/2004 | Yuan et al. | |

FOREIGN PATENT DOCUMENTS

| | | |
|---|---|---|
| DE | 21 39 039 A1 | 2/1972 |
| DE | 30 29 249 A1 | 2/1982 |
| WO | WO 01/63761 * | 8/2001 |
| WO | 0247195 | 6/2002 |

OTHER PUBLICATIONS

PCT International Search Report PCT/IB2007/53357, mailing date Feb. 13, 2008.

\* cited by examiner

*Primary Examiner* — Barbara Summons
(74) *Attorney, Agent, or Firm* — William J. Kubida; Peter J. Meza; Hogan Lovells US LLP

(57) ABSTRACT

A method to track and control the resonance frequency of a band-pass filter provides a solution for the sensitivity limitations against temperature and process variations. A phase sensing module obtains the phase difference between the input and output and a negative feed-back control architecture can be used to tune the filter's resonance over the input RF frequency.

15 Claims, 11 Drawing Sheets

FILTER-TRACKING AND CONTROL METHOD

CROSS-REFERENCE TO RELATED APPLICATIONS

The present application relates to and claims the benefit of priority to PCT Application PCT/IB2007/053357 filed Aug. 22, 2007, and of European Patent Application No. 06300886.6 filed Aug. 23, 2006, both of which are hereby incorporated by reference in their entireties for all purposes as if fully set forth herein.

FIELD OF THE INVENTION

The invention relates to filter resonance. In particular, the present invention relates to controlling and tuning the resonance frequency of a band-pass filter.

BACKGROUND OF THE INVENTION

Modern wireless communication increasingly uses more simultaneous receiver (Rx) and transmitter (Tx) communication links such as CDMA networks as well as simultaneous GPS and broadcast features. These Tx and Rx channels operate simultaneously with a large difference of levels. For example, when the Rx signal goes below noise, the Tx signal can be very high with the leaked Tx to Rx signal being also high even when a duplexer for attenuation is used. Furthermore, during communications, a number of interferers may be present at the Rx input. The combination of all these interferers, Tx and jammers, will result in an important Signal-to-Noise Ratio (SNR) degradation due to the limited linearity of the Rx channel such as cross-modulation noise, inter-modulation products noise, and the like.

Typically, regarding the Rx path, a Low-Noise Amplifier (LNA) is the first element to degrade the SNR and the performance is managed by its IIP3 specification. However, the mixer is also a non-linear block and the interference levels have to be managed to avoid further SNR degradation. Normally, an inter-stage filter is added between the LNA and the mixer to limit the impact of these interferers. The inter-stage filter is usually a non-integrated Surface Acoustic Wave (SAW) or Bulk Acoustic Wave (BAW) filter, which presents the disadvantages of cost and Bill-Of-Materials (BOM) increase. Additionally, two main factors limit the integration of such filters, namely, the resonance frequency sensitivity to temperature and process variations, and the Q-factor or quality-factor limitations (amount of resistance to resonance).

For example, to solve the above drawbacks of the prior art, various solutions of tracking the resonance frequency have been advanced. In one solution, namely, in U.S. Pat. No. 6,940,348 B1, the LC pass-band filter (a filter having an inductor L and a capacitor C) is matched with an auxiliary oscillator and using the locking loop, performs its control directly on the auxiliary oscillator and not on the LC filter itself. The control information is then applied on the LC filter in a second step. However, the LC filter is not included into any feedback control loop, which results in a number of drawbacks.

First, the matching between the LC filter and the oscillator's tank presents a certain degree of error or mismatch due to process and temperature gradients. Thus, even if the control applied on the oscillator itself is perfect, this same control cannot be true for the LC filter because the control loop cannot correct or eliminate the mismatch error between the LC filter and the tank's oscillator.

Secondly, a good matching between the LC filter and the oscillator's tank requires placing each one extremely close to each other. The oscillator's tank, being a strong source of electromagnetic radiation, is able to magnetically couple with the LC filter and considerably pollute the receiver input with many undesirable frequency interferers that will imply high degrading consequences on the receiver sensitivity.

Therefore, in view of these concerns and drawbacks, there is a continuing need for developing a new and improved system and method for controlling and tuning the resonance frequency of a filter which would avoid the disadvantages and above mentioned problems while being cost effective and simple to implement.

SUMMARY OF THE INVENTION

One aspect of the invention is to provide a new method and system of tracking and controlling a resonance frequency of a band-pass filter. The new method and system accurately tracks and controls the resonance frequency of a filter, and provides a solution for the sensitivity limitation against temperature and process variations. In particular, the invention can include a method of providing a phase sensing module to obtain a phase difference between the input and output and a negative feed-back control architecture that can be used to tune the filter's resonance accurately over the input RF frequency. A phase sensing module, according to one embodiment of the present invention, comprises a local oscillator (LO) frequency that equals the input RF frequency, a frequency modulator to down-convert the input and output channels to DC zero frequency terms, and a low-pass filter used to obtain the desired DC terms. A negative feed-back control architecture includes a comparator of which one input is connected to the ground. When the input RF frequency moves away, the control loop tracks the new RF frequency position and automatically re-tunes the filter's resonance over the new RF frequency.

One or more of the following features of the present invention may also be included.

In one aspect of the invention, the method of tracking and controlling a resonance frequency of a band-pass filter also includes suppressing the down-converted terms resulting from a plurality of interferers.

In another aspect of the invention, the tuning of the phase includes using a negative feedback control acting on the resonance frequency of the band-pass filter.

In yet another aspect of the invention, the comparator is operated either in a single-ended or in a differential mode.

Embodiments of the invention may also have one or more of the following advantages.

The invention can provide accurate resonance tuning of a filter over a given RF frequency. Further, it can provide broadband frequency operation, which gives the possibility of a single implemented solution compatible with a multi-bands/multi-mode application.

Moreover, the invention can provide immunity against temperature and process variations and gradients, and full integration capability, allowing the removal of on-board SAW filters, which in turn favors the BOM and PCB (Printed Circuit Board) area reduction.

Additionally, the invention can make possible low-power and simple integrable functions, as well as autonomous functionality regarding annexed-to-Rx circuitries (Tx, Baseband, and the like). Further, the invention can provide a wider application range. Therefore, advantageously, the architecture of the invention operates and accomplishes the control of the filters even when the applied signal is a frequency channel or band or has a certain frequency extension.

Furthermore, the invention can provide in the application a direct control on the LC filter. Consequently, there is no additional mismatch or resultant error components, thereby ensuring higher control and accuracy aptitude.

Another benefit of the present invention is that the invention uses the input frequency as a reference frequency to lock the filter, so there is no need for an additional "reference frequency". And by placing the pass-band filter at the input of a receiver chain, the present invention provides the added advantage of keeping only the needed frequency band and filtering all the undesirable spectral components.

These and other aspects of the invention will become apparent from and elucidated with reference to the embodiments described in the following detailed description, drawings and from the claims.

BRIEF DESCRIPTION OF THE DRAWINGS

The aforementioned and other features and objects of the present invention and the manner of attaining them will become more apparent, and the invention itself will be best understood, by reference to the following description of one or more embodiments taken in conjunction with the accompanying drawings, wherein.

Figure 1:
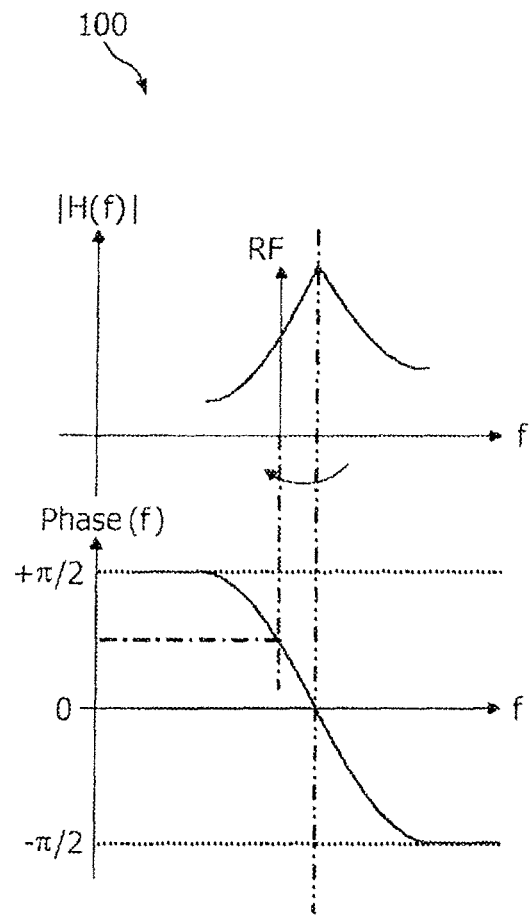
FIG. 1 illustrates a filter response in gain and in phase, showing how the phase of a pass-band filter presents a zero-singularity at its resonance frequency.

The Figures depict embodiments of the present invention for purposes of illustration only. One skilled in the art will readily recognize from the following discussion that alternative embodiments of the structures and methods illustrated herein may be employed without departing from the principles of the invention described herein.

DETAILED DESCRIPTION

Specific embodiments of the present invention are hereafter described in detail with reference to the accompanying Figures. Like elements in the various Figures are identified by like reference numerals for consistency. Although the invention has been described and illustrated with a certain degree of particularity, it is understood that the present disclosure has been made only by way of example and that numerous changes in the combination and arrangement of parts can be resorted to by those skilled in the art without departing from the spirit and scope of the invention.

Referring to FIG. 1, a filter response in gain and in phase is illustrated in a graph 100. The phase of a pass-band filter (LC filter) presents a zero-singularity at its resonance frequency. One principle of the invention is based on the phase sensing and annulling of the filter. When the resonance frequency is different from the input RF signal frequency, the difference of phase between the input and the output signals throughout the filter will be different from zero.

Figure 2A:
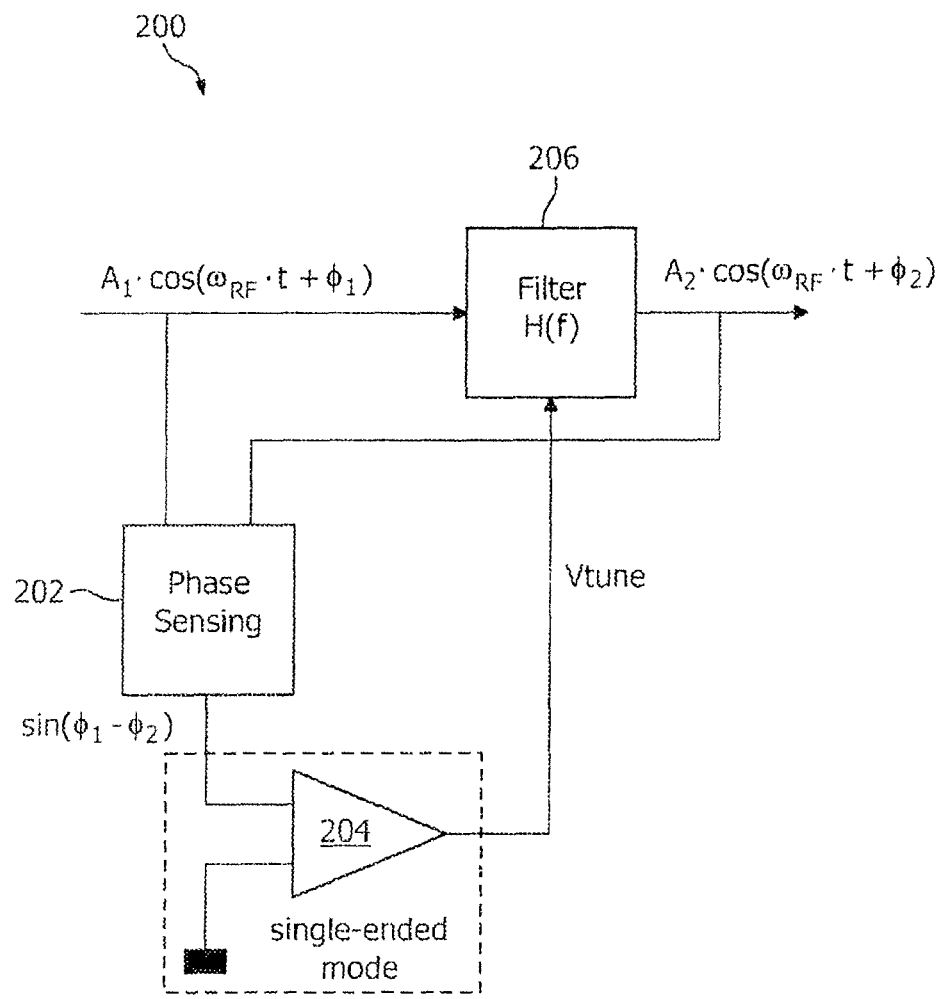
FIG. 2A shows the principle of a control loop allowing the filter resonance tuning over the input RF frequency.

Referring now in addition to FIG. 2A, the principle of a control loop allowing the filter resonance tuning over the input RF frequency is illustrated. In other words, FIG. 2A shows a circuit architecture 200 of a resonance frequency of a filter tracking and controlling solution. The circuit architecture 200 requires the cooperation of three modules: a phase sensing module 202, a negative feed-back control circuit which includes a comparator 204, and a filter 206.

In addition to the phase difference, the input and the output signals, i.e., the phase difference sensing 202, by forcing this difference to be equal to zero via a negative feed-back control acting on resonance frequency of the filter 206, the resonance of the filter 206 can be accurately tuned over the input RF frequency. Moreover, when the RF frequency moves away, the control loop tracks the new RF frequency position to automatically re-tune the filter's resonance over the new RF frequency.

Figure 2B:
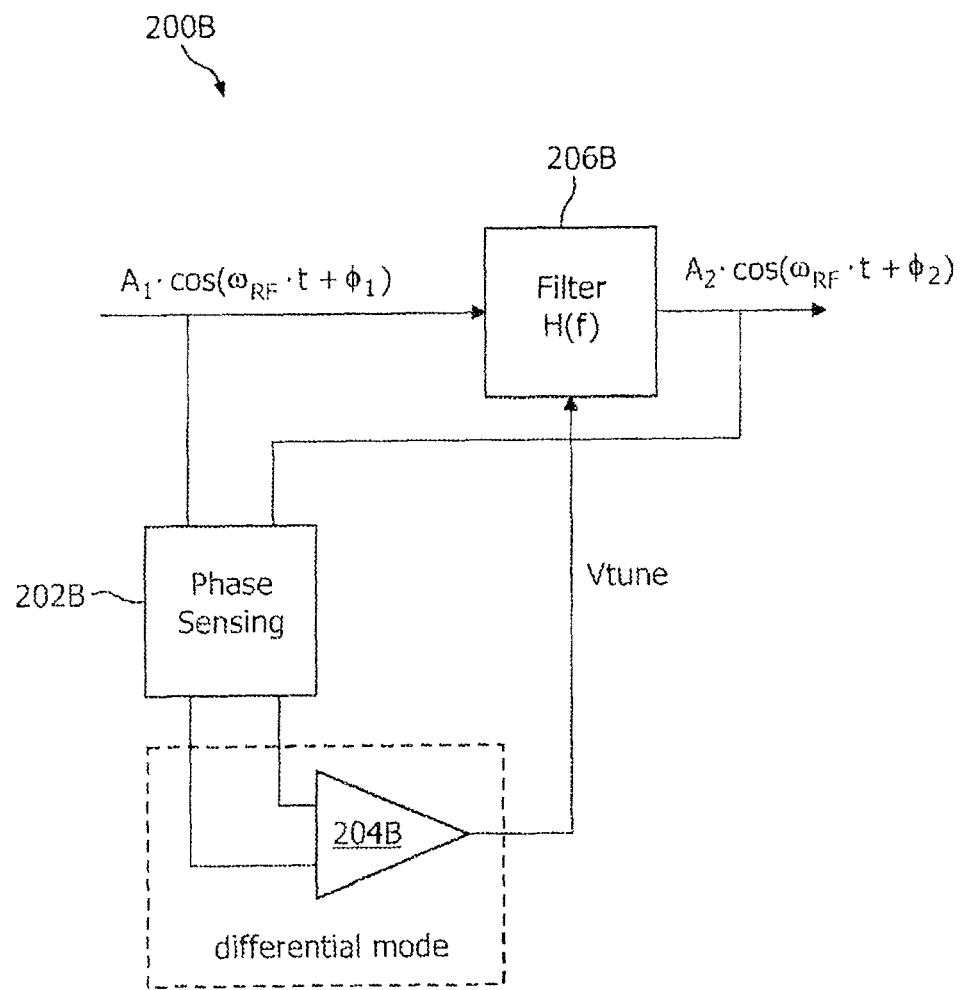
FIG. 2B shows the principle of a control loop allowing the filter resonance tuning over the input RF frequency where a comparator block is operated in a differential mode.

The comparator block 204 is able to operate in either single-ended mode or in a differential mode at its input side. In FIG. 2A, the comparator 204 operates in a single ended mode. Referring in addition to FIG. 2B, a comparator block 204B is shown operated in a differential mode. In the differential case, no connection to ground is needed at the comparator's input. The phase sensing module 202B provides the phase information of input and output signals which are connected to the inputs of the comparator 204B, respectively. The comparator 204B forces its inputs to be equal and then the output of the comparator 204B is sent back to the filter 206B to tune the resonance frequency.

Figure 3A:
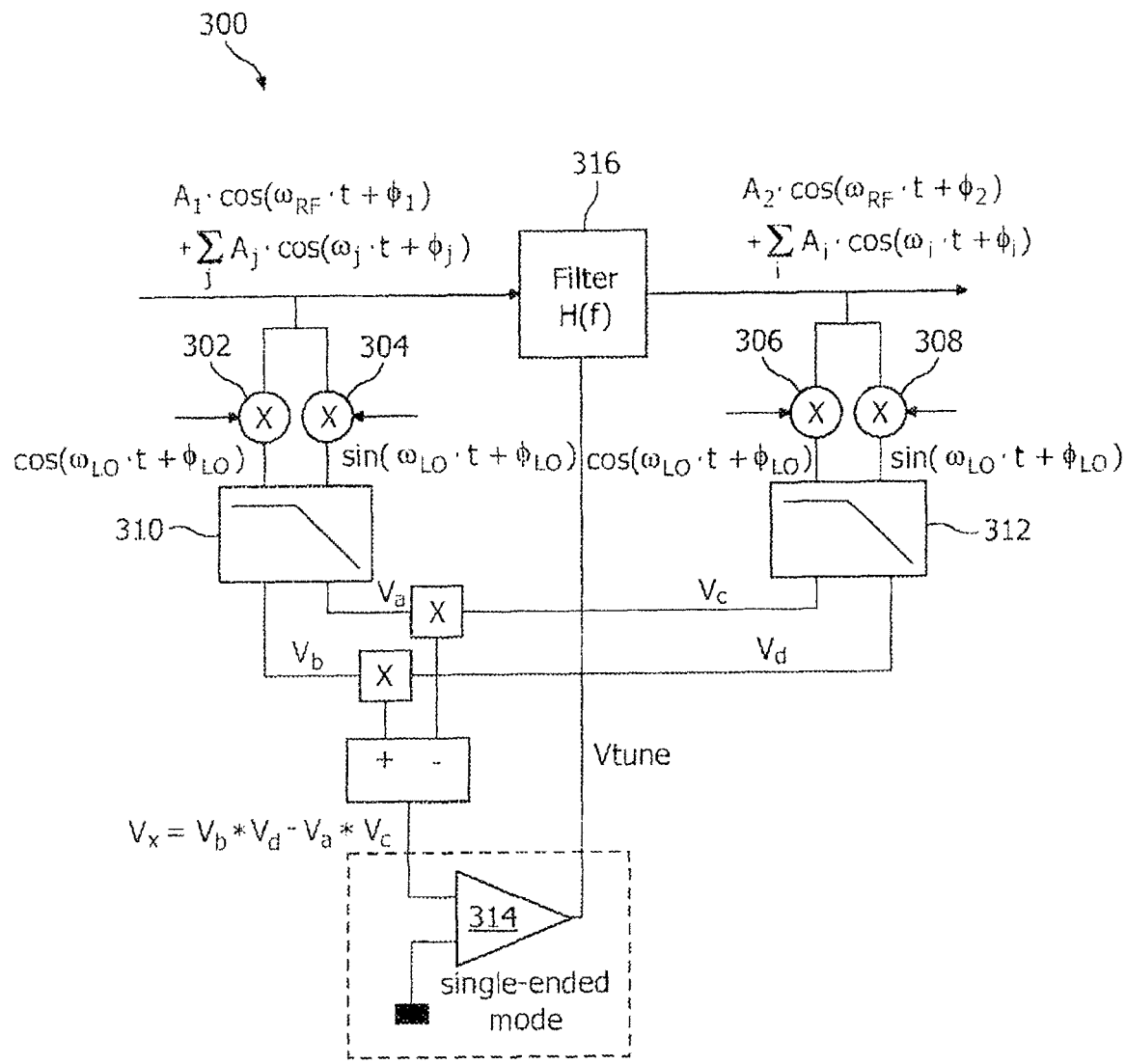
FIG. 3A is an example of the filter resonance control loop implementation, illustrating the implementation of an improved method and system according to one of the embodiments of the present invention.

Referring now to FIG. 3A, a filter resonance control loop implementation according to one embodiment of the present invention is illustrated. A phase sensing module 300 primarily includes two frequency modulators 302, 304 used to down-convert the frequency of an input signal, a low-pass filter 310 used in the input terminal, two frequency modulators 306, 308 used to down-convert the frequency of the output signal, and a low-pass filter 312 used in the output terminal.

Considering the following signal at the filter's input:

$A_1 \cdot \cos(\omega_{RF} \cdot t + \phi_1)$: input RF signal $\sum_j A_j \cdot \cos(\omega_j \cdot t + \phi_j)$: Expression of all interferers present at the input.

Then, at the filter's output, the results are:
$A_2 \cdot \cos(\omega_{RF} \cdot t + \phi_2)$: output RF signal $$\sum_i A_i \cdot \cos(\omega_i \cdot t + \phi_i): \text{Interferers response throughout the filter.}$$

The above scenario assumes that a LO (Local Oscillator) frequency equals the input RF frequency based upon the well-known Zero-IF architecture or similar architectures. One embodiment of the present invention accurately tracks and controls the resonance frequency of a filter, as is hereafter described.

First, referring still to FIG. 3A, the input and output signals are sent into the frequency modulators 302~304, 306~308, respectively. The down-conversion of the input and output RF frequencies, which is implemented in the frequency modulators 302~304, 306~308, provides DC terms representing the difference of phase between the RF signals and the LO, namely, $(\phi_{LO} - \phi_1)$ & $(\phi_{LO} - \phi_2)$.

Second, the DC terms then are sent into the low-pass filters 310, 312 respectively. The low-pass filters 310, 312 suppress the high frequency mixed term $(2 \cdot \omega_{RF})$ and all the down-converted terms resulting from the interferers $(\omega_j \pm \omega_{LO})$ & $(\omega_i \pm \omega_{LO})$. The cut-off frequency of the low-pass filter can be set low so that it can eliminate all non-linearity products to modulate the DC terms. This can also lower the linearity requirements of the mixers as well as their power consumption level.

Third, the desired DC terms are then sent to the comparator 314 of which one input is connected to the ground. After comparison, the output of comparator 314 is sent back to the filter 316 to tune the phase.

Consequently, taking the down-converted terms at the low-pass filter 310, 312 outputs, the following is obtained:

$A_1 \cdot \cos(\omega_{RF} \cdot t + \phi_1) \cdot \sin(\omega_{LO} \cdot t + \phi_{LO}) \Rightarrow V_a \propto A_1 \cdot \sin(\phi_{LO} - \phi_1)$ $A_1 \cdot \cos(\omega_{RF} \cdot t + \phi_1) \cdot \cos(\omega_{LO} \cdot t + \phi_{LO}) \Rightarrow V_b \propto A_1 \cdot \cos(\phi_{LO} - \phi_1)$ $A_2 \cdot \cos(\omega_{RF} \cdot t + \phi_2) \cdot \cos(\omega_{LO} \cdot t + \phi_{LO}) \Rightarrow V_c \propto A_2 \cdot \cos(\phi_{LO} - \phi_2)$ $A_2 \cdot \cos(\omega_{RF} \cdot t + \phi_2) \cdot \sin(\omega_{LO} \cdot t + \phi_{LO}) \Rightarrow V_d \propto A_2 \cdot \sin(\phi_{LO} - \phi_1)$ And when $V_x = V_b \cdot V_d - V_a \cdot V_c$, then, $V_x \propto \text{cc } \sin(\phi_2 - \phi_1)$, and the condition of the control loop becomes:

$V_x = 0 \Leftrightarrow \phi_2 = \phi_1$

As a result, the filter resonance frequency becomes equal to the input RF frequency.

Figure 3B:
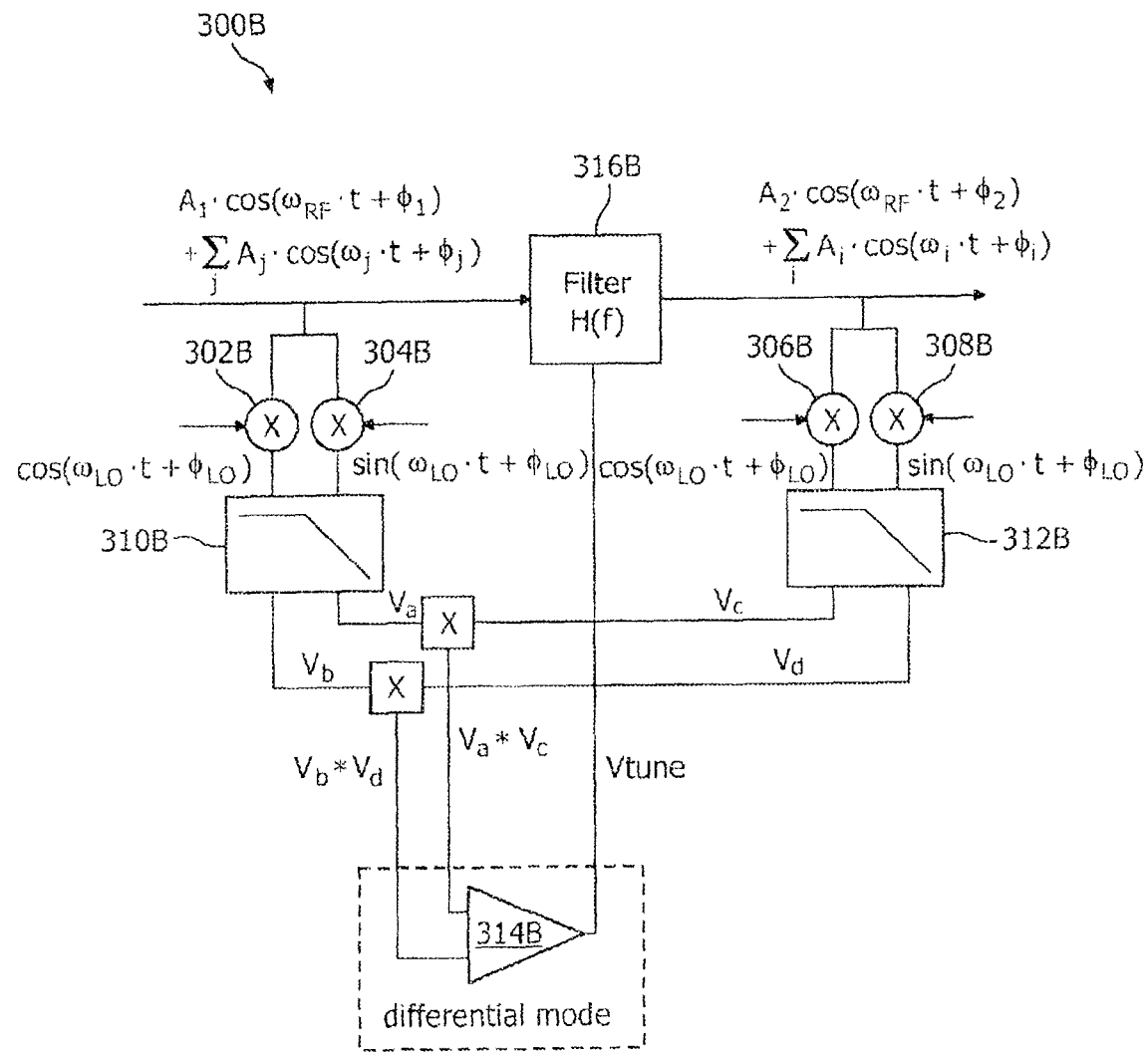
FIG. 3B is an example of the filter resonance control loop implementation where a comparator block is operated in a differential mode, according to one of the embodiments of the present invention.

The comparator block 314 is able, according to one embodiment of the present invention, to operate in either single-ended mode or in a differential mode at its input side. In FIG. 3A, the comparator 314 operates in a single ended mode. Referring now in addition to FIG. 3B, a comparator operating in a differential mode is also a possibility. No connection to ground is needed in this case at the input of the comparator 314B. The multiplier provides the information on the phase difference '$V_x$' as a differential signal directly connected to the input of the comparator 314. The comparator 314B forces its inputs to be equal, as follows:

$V_b \cdot V_d = V_a \cdot V_c \Leftrightarrow V_b \cdot V_d - V_a \cdot V_c = 0$ And if $V_x = V_b \cdot V_d - V_a \cdot V_c$, then, $V_x \propto \sin(\phi_2 - \phi_1)$, and the condition of the control loop becomes:

$V_x = 0 \Leftrightarrow \phi_2 = \phi_1$

As a result, the filter resonance frequency becomes equal to the input RF frequency.

Figure 4:
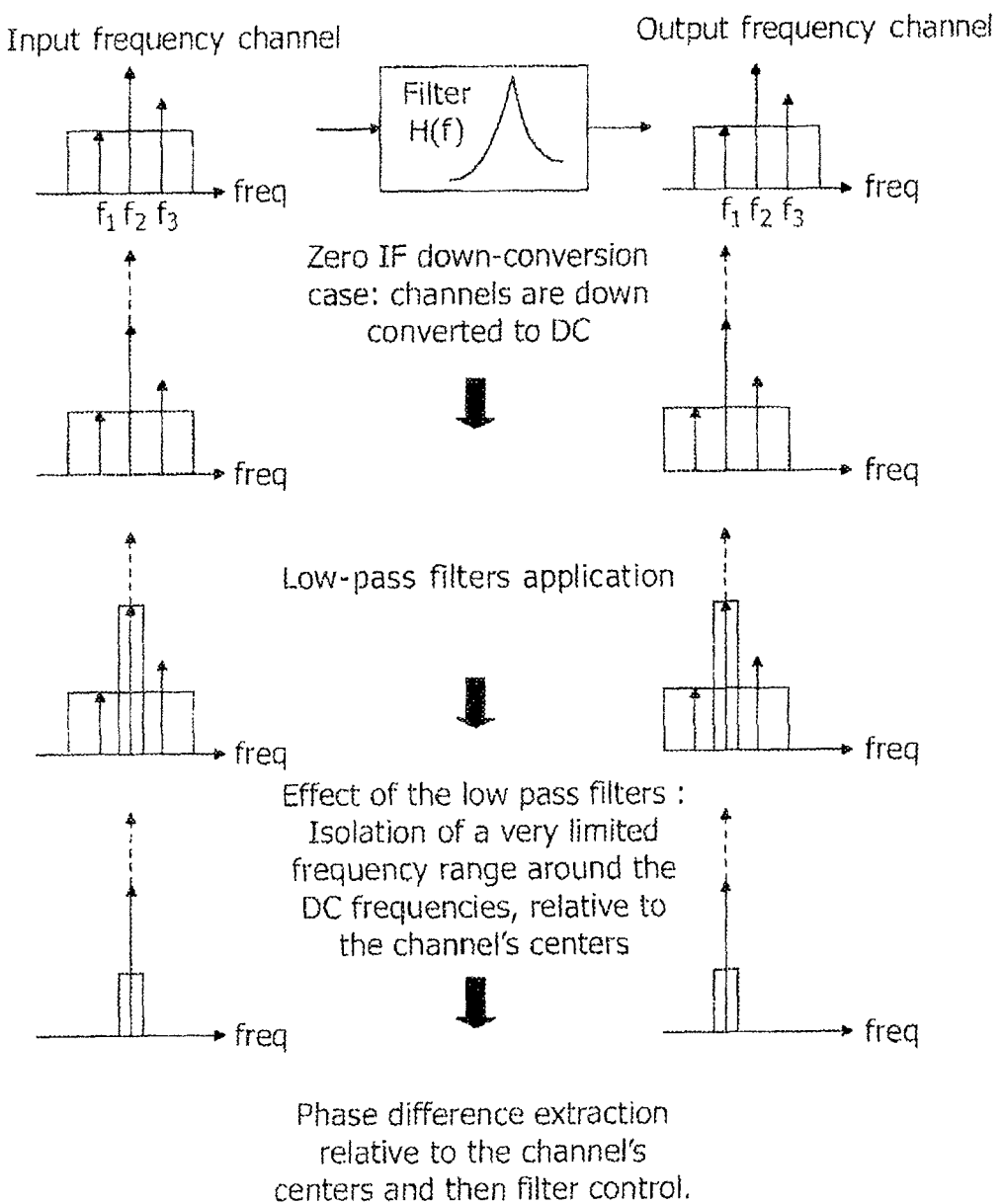
FIG. 4 illustrates the advantage in overcoming parasitic and unwanted down-converted DC and low frequency terms, according to one of the embodiments of the present invention.

Referring now in addition to FIG. 4, one advantage in overcoming parasitic and unwanted DC and low frequency terms, according to one of the embodiments of the present invention, is illustrated. The use of a Local Oscillator (LO) signals to convert the channels to DC at the filter's input and output overcomes the issue of parasitic and unwanted DC and low frequency terms.

After having the input and output channels down-converted to DC by the

LO signals, the use of a low-pass filter with a very low cut-off frequency assists in keeping the wanted DC term, or a very limited frequency region, around each wanted DC term. Since each DC term is proportional to the phase information, respectively of the input and output channel centers, this permits, in the next step, the present invention to obtain the phase difference information related to the channel centers and accomplish the filter control, even when the input signal has a certain frequency extension.

The use of the low-pass filters 310, 312 of FIG. 3A, with a very low cut-off frequency, is linked to the Zero IF architecture, where the LO is equal to the central frequency of the received band or channel. The same proposed principle and implementation is equally valid in the case of a Near Zero IF architecture, with the exception that the previously mentioned low-pass filters 310, 312 are replaced by pass-band filters, e.g., poly-phase filters, having a very low cut-off frequency.

Figure 5:
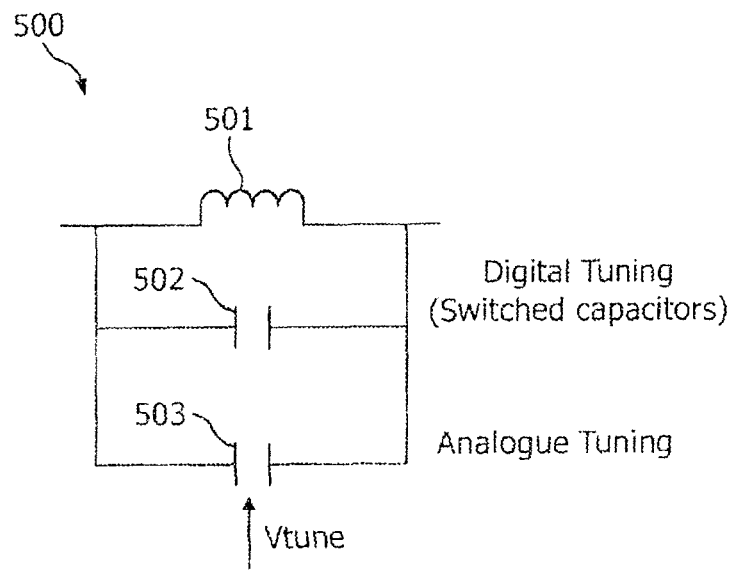
FIG. 5 is an example of implementation of a broad-band tunable filter, according to one of the embodiments of the present invention.

Referring now to FIG. 5, an example of implementation of a broad-band tunable filter is illustrated in diagram 500, according to one embodiment of the present invention. The control loop acts as an analogue-tuning loop. A digital tuning, ensuring a broadband operating frequency range is possible using high-Q switched capacitors 502. This can be feasible by applying a digital pre-calibration phase, before the analogue tuning phase.

Figure 5A:
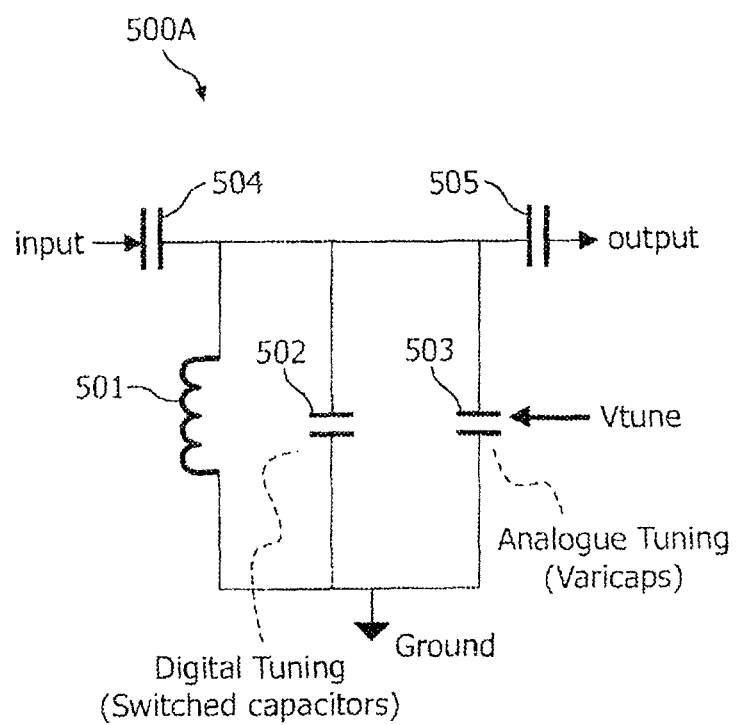
FIGS. 5A-5B are examples of a singled-ended first order LC filter.
Figure 5B:
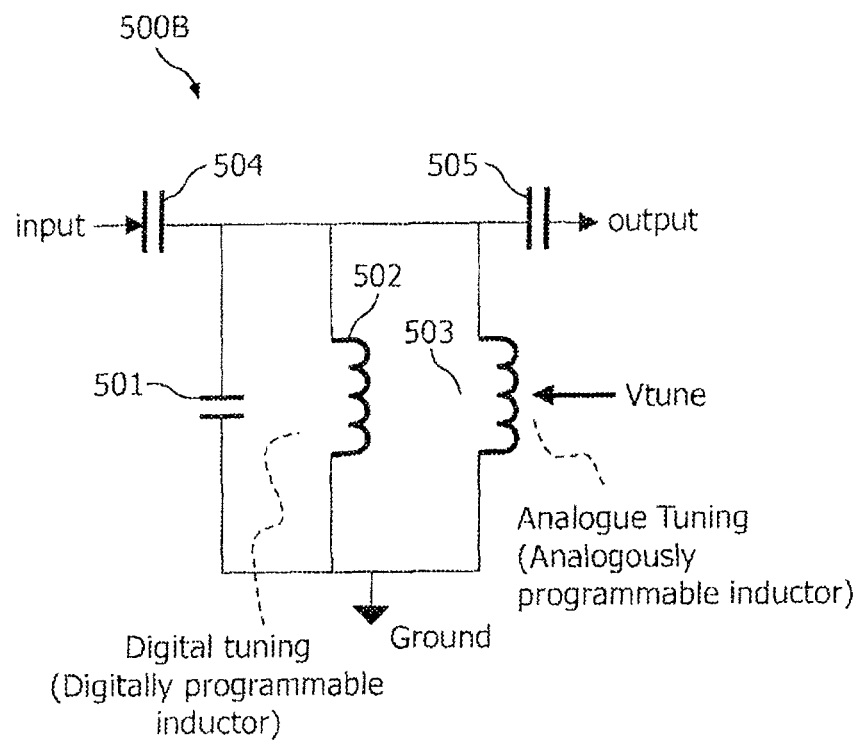

Referring now to FIGS. 5A and 5B, diagram 500A shows an example of a single-ended first order LC filter. A higher order can be naturally used depending on the rejection specification and requiring in this case more components. The capacitors 504 and 505 are optional and are used to free the input and output DC levels. The presence of the capacitors 504 and 505 should not intervene into the resonance behavior. Components 501, 502 and 503 are the components which set the resonance behavior. The resonance control may be achieved in one or two steps. First, in the case of a wide tuning range, a first pre-calibration process, i.e., coarse tuning, is used to make the filter's resonance very close to the wanted resonance frequency. This can be achieved by a digital programming or tuning, preceding the fine control loop. The component 502 is shown in FIGS. 5A and 5B in the diagrams 500A and 500B, as a means allowing such a digital pre-calibration phase. This pre-calibration can be done using switched capacitors, as shown in FIG. 5A, but it may also be possible using a digitally programmable inductor, such as that shown in FIG. 5B and as would be known by one skilled in the relevant art. Secondly, the fine control loop is initiated, and by acting on "Vtune" (analogue tuning), a very accurate resonance tuning over the input RF frequency is obtained. Such an analogue control may be done using a Varicap, as in diagram 500A or an analogously programmable inductor as in diagram 500B.

In the case of a limited tuning range, the first digital pre-calibration phase may not be useful or necessary. In this instance, the analogue tuning loop can be directly initiated.

Additionally, all combinations among 501, 502 and 503 components are allowed irrespective of whether inductors or capacitors are used. The sole condition is to globally provide an equivalent LC tank in order to ensure the resonance behavior. In effect, in diagram 500A, for example, the 502 component can be replaced with a digitally programmable inductor, or the 503 component can be replaced by an analogously programmable inductor, giving two further derivatives. The same is applicable for FIG. 5B, in diagram 500B, where the component 502 may be replaced by a switched-capacitors tank, or the component 503 may be replaced by a Varicap, providing two further derivatives.

Figure 5C:
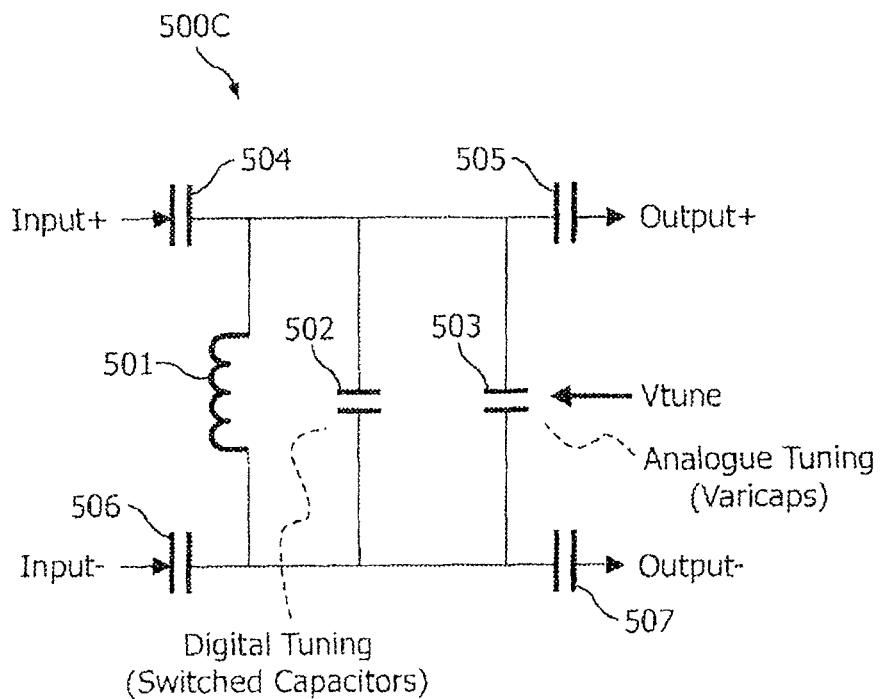
FIGS. 5C-5D are examples of LC-filters in differential configurations.
Figure 5D:
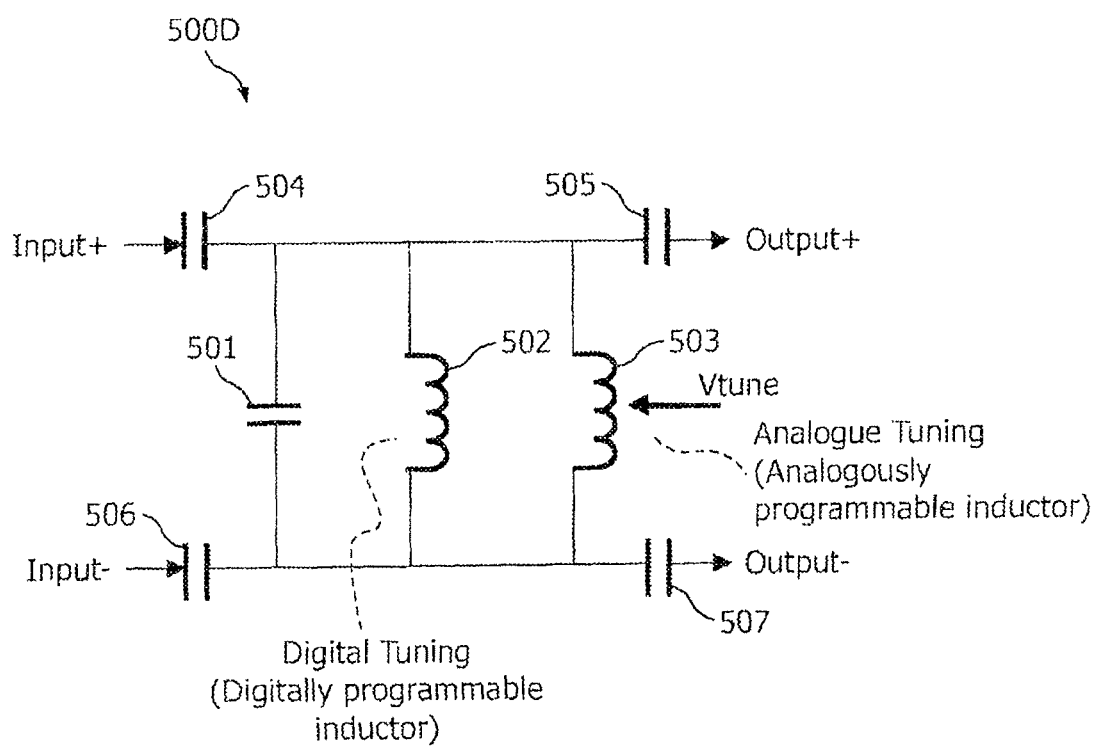

Referring to FIGS. 5C and 5D, the different mode of use of LC filters are illustrated. Whereas FIGS. 5A and 5B in diagrams 500A and 500B provide single-ended configurations, differential configurations are also possible. There are particular advantages by the use of differential configurations. There is no need for a ground reference connection in a differential mode. All of the foregoing remarks concerning the control steps such as coarse/fine tuning and the freedom of choosing the LC variable components are equally valid in applications using the differential mode as well.

Figure 6:
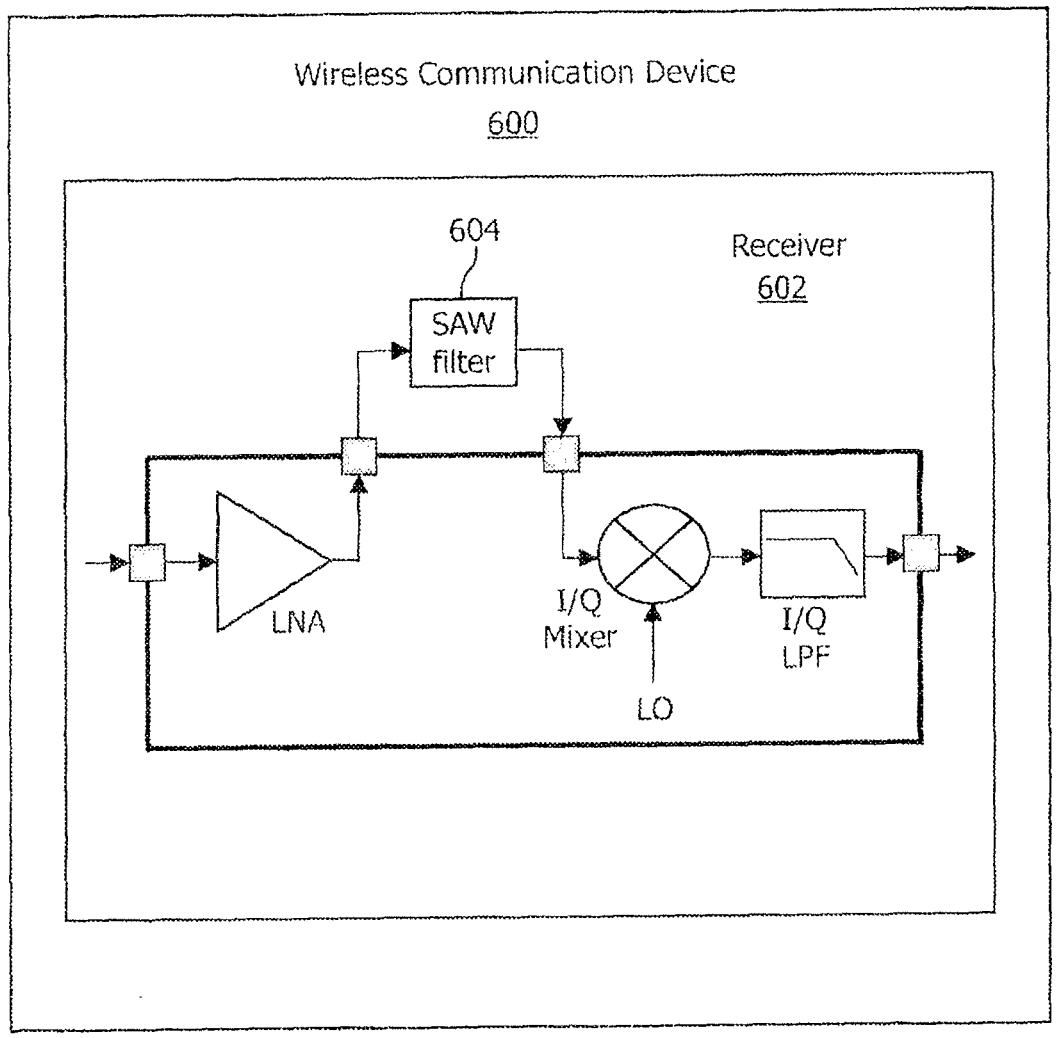
FIG. 6 illustrates an exemplary wireless communication device using an external SAW filter.

Referring in addition to FIG. 6, a wireless communication device 600 according to one embodiment of the present invention is shown. The device 600 includes a receiver 602, using an external SAW filter 604. Figure shows an integrated RF front-end chain in the receiver 602, showing a Zero-IF IC receiver architecture.

Figure 7:
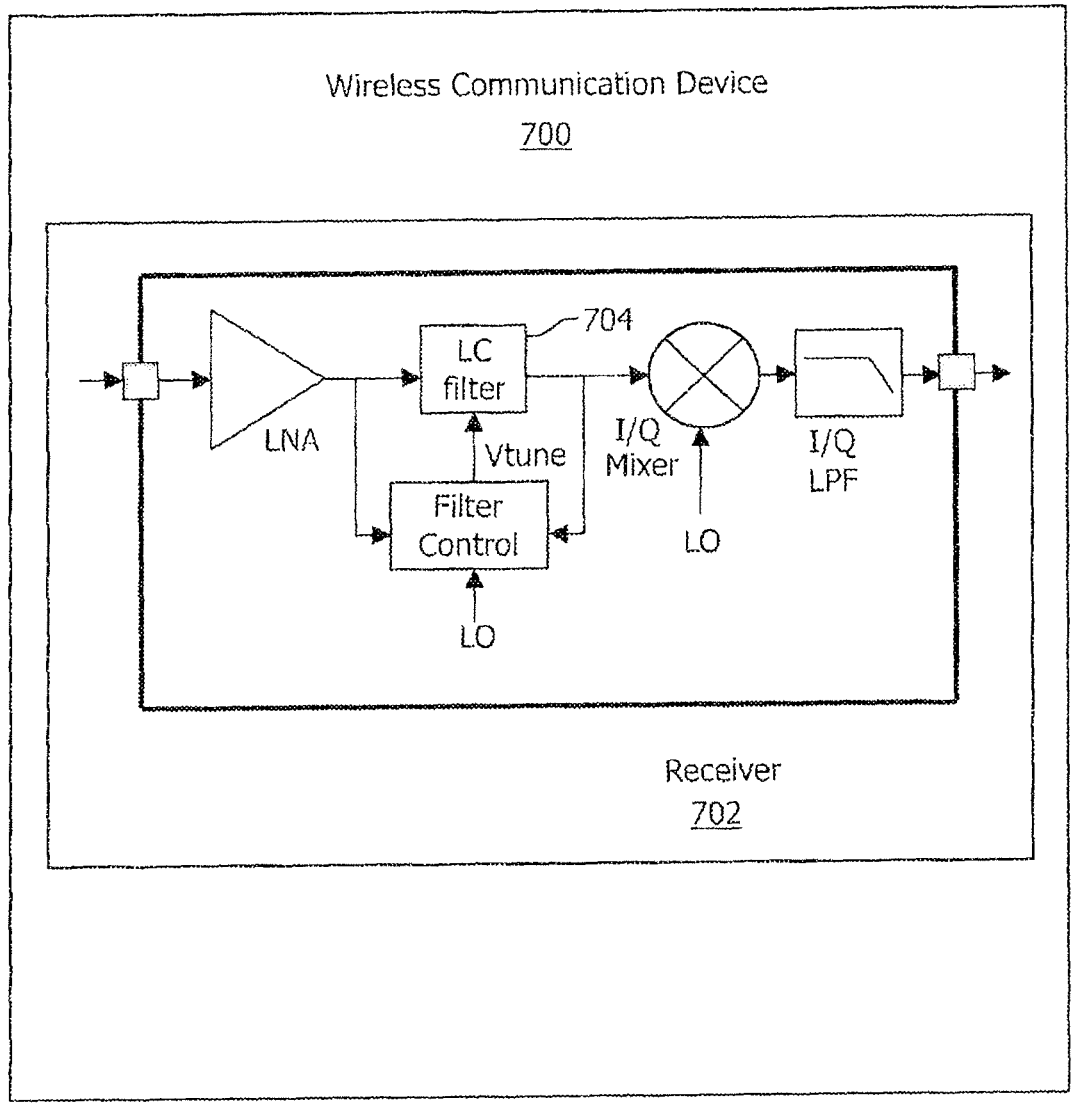
FIG. 7 illustrates another exemplary device incorporating an LC filter and its control block according to the present invention.

Referring to FIG. 7, another wireless communication device 700 is illustrated, which incorporates an LC filter and its control block according to the present invention. In the device 700, an integrated RF front-end chain in the receiver 702 is shown, using an integrated LC filter 704 with its control block.

While there has been illustrated and described what are presently considered to be the preferred embodiments of the present invention, it will be understood by those of ordinary skill in the art that various other modifications may be made, and equivalents may be substituted, without departing from the true scope of the present invention.

For example, although the foregoing description used the name local oscillator, this may be understood as embodying a unique frequency plan, by using the input frequency as a reference frequency to lock the filter. Thus, there is no need for additional reference frequencies. Further, a local oscillator does not denote that the oscillator is placed either locally or nearby the LC filter. The LO may be place anywhere or as far from the LC filter as desired.

Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims and their equivalents.

The invention claimed is:

1. A method for tracking and controlling a resonance frequency of a band-pass filter, said method comprising:
    sending an input and an output signal into a plurality of frequency modulators, each signal being associated with a phase;
    down-converting said input and output signal in the plurality of frequency modulators, thereby providing a DC term corresponding to a zero frequency representation of a phase difference between said input signal and a local oscillator frequency and between said output signal and said local oscillator frequency;
    sending each DC term into one of a plurality of low-pass filters and thereafter to a comparator having an output based on a comparison of phase information of said input and output signals; and
    tuning the band-pass filter phase using the output of the comparator based on the phase of the input signal,
    wherein the tuning of the phase of the band-pass filter comprises using a negative feedback control acting on the resonance frequency of the band-pass filter, and wherein the negative feedback control comprises an analogue tuning loop.

2. The method of claim 1, further comprising suppressing down-converted terms resulting from a plurality of interferers.

3. The method of claim 1 wherein the comparator is operated either in a single-ended or in a differential mode.

4. The method of claim 1 wherein the local oscillator frequency equals an input RF frequency of the input signal.

5. The method of claim 1, further comprising using high-Q switched capacitors for digital tuning and operating in a broadband frequency range.

6. A system configured to track and control a resonance frequency of a band-pass filter, said system comprising a phase sensing module comprising:
    at least one frequency modulator configured to down-convert input and output signals and configured to provide a down-converted term corresponding to a zero frequency representation of a phase difference between said input signal and a local oscillator frequency and between said output signal and said local oscillator;
    a low-pass filter coupled to an output of the at least one frequency modulator configured to suppress high-frequency mixed terms and high-frequency down-converted terms and overcome parasitic down-converted terms; and
    a comparator configured to compare the phase of the input and output signals and configured to send an output of the comparator to tune the band-pass filter, said tuning based on a comparison of the phase of the output signal and the phase of the input signal,
    wherein the system further comprises a negative feedback control mechanism wherein the output of the comparator is transmitted to the filter to tune the phase of the band-pass filter, and wherein the negative feedback control mechanism comprises an analogue tuning loop.

7. The system of claim 6, wherein an input of the comparator is connected to ground.

8. The system of claim 6, wherein the local oscillator frequency used in the at least one frequency modulator equals the input RF frequency.

9. A computer readable storage medium tangibly embodying a program of instructions executable by a machine wherein said program of instruction comprises a plurality of program codes for tracking and controlling a resonance frequency of a band-pass filter, said band-pass filter being associated with a phase, said program of instruction comprising:
    program code for sending input and output signals into a plurality of frequency modulators, each signal being associated with a phase;
    program code for down-converting said input and output signals in the plurality of frequency modulators, thereby providing for said input and output signal a DC term corresponding to a zero frequency representation of a phase difference between said input signal and a local oscillator frequency and said output signal and the local oscillator frequency;

program code for sending each DC term into one of a plurality of low-pass filters and thereafter to a comparator having an output based on a comparison of phase information of said input and output signals; and program code for tuning the band-pass filter phase using the output of the comparator based on the phase of the input signal.

10. The computer-readable storage medium of claim 9 further comprising program code for suppressing down-converted terms resulting from a plurality of interferers.

11. The computer-readable storage medium of claim 9 wherein the program code for tuning includes program code for using a negative feedback control acting on the resonance frequency of the band-pass filter.

12. The computer-readable storage medium of claim 9 further comprising program code for using high-Q switched capacitors for digital tuning and a broadband operating frequency range.

13. A wireless communication device comprising a receiver configured to track and control a resonance frequency of a band-pass filter, said receiver comprising:

at least one frequency modulator configured to down-convert input and output signals providing for each input and output signal a DC term corresponding to zero frequency representation of a phase difference between said input signal and a local oscillator frequency and said output signal and the local oscillator frequency;

a low-pass filter coupled to an output of the at least one frequency modulator configured to suppress high-frequency mixed and DC terms and overcome parasitic DC terms; and a comparator configured to compare the phase of the input and output signals and send an output to tune the band-pass filter, said tuning based on a comparison of the phase of the output signal and the phase of the input signal, wherein the comparator is configured to tune the phase of the band-pass filter, and the tuning comprises using a negative feedback control acting on the resonance frequency of the band-pass filter, and wherein the negative feedback control comprises an analogue tuning loop.

14. The wireless communication device of claim 13 wherein the at least one frequency modulator includes a plurality of interferers that suppresses down-converted terms.

15. The wireless communication device of claim 13 wherein the comparator is operated either in a single-ended or in a differential mode.

* * * * *